US012094569B2

(12) United States Patent
Chen et al.

(10) Patent No.: US 12,094,569 B2
(45) Date of Patent: Sep. 17, 2024

(54) 3D MEMORY STRUCTURE AND CIRCUIT

(71) Applicant: MACRONIX International Co., Ltd., Hsinchu (TW)

(72) Inventors: Chung-Kuang Chen, Hsinchu (TW); Chun-Hsiung Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 257 days.

(21) Appl. No.: 17/694,313

(22) Filed: Mar. 14, 2022

(65) Prior Publication Data
US 2023/0290392 A1    Sep. 14, 2023

(51) Int. Cl.
*G11C 7/18* (2006.01)
(52) U.S. Cl.
CPC .......... *G11C 7/18* (2013.01); *G11C 2207/005* (2013.01)
(58) Field of Classification Search
CPC .............................. G11C 7/18; G11C 2207/005
See application file for complete search history.

(56) References Cited

U.S. PATENT DOCUMENTS

| 2019/0287995 A1* | 9/2019 | Oike | H10B 43/35 |
| 2021/0118862 A1* | 4/2021 | Maejima | G11C 16/26 |

FOREIGN PATENT DOCUMENTS

| TW | 202117729 | * | 5/2021 |
| TW | 202203437 | * | 1/2022 |

OTHER PUBLICATIONS

"Office Action of Taiwan Counterpart Application", issued on Dec. 12, 2022, p. 1-p. 6.

* cited by examiner

*Primary Examiner* — Alexander Sofocleous
*Assistant Examiner* — Tracy R Hampton
(74) *Attorney, Agent, or Firm* — J.C. PATENTS

(57) ABSTRACT

A three-dimensional memory structure is provided and including a memory array, including a first and a second sub-arrays, each having a first selection line, plural word lines, and a second selection line; a connection structure, including plural connection areas, and at least one of extension structures of the first selection line, the plural of word lines, and the second selection line is coupled to a corresponding connection area of the plurality of connection areas; a pass gate set, arranged under the connection structure and between the first and the second sub-arrays, the pass gate set including plural pass gates, and, the word lines and the second selection line, and the pass gates are respectively coupled to the corresponding connection areas; and a drive circuit, coupled to the pass gate set, and disposed under the connection structure.

20 Claims, 8 Drawing Sheets

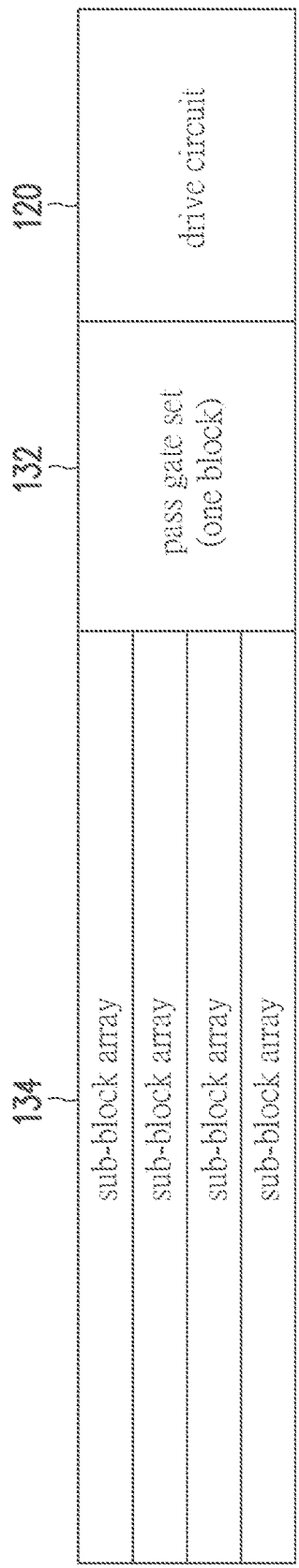
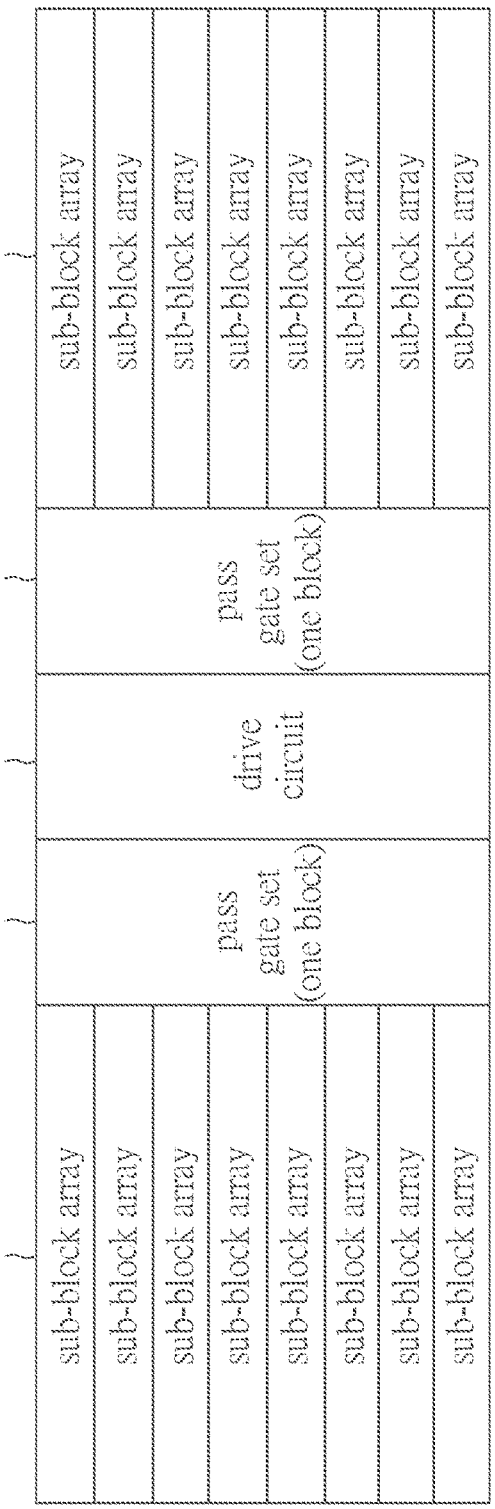
FIG. 2A (RELATED ART)
FIG. 2B (RELATED ART)

3D MEMORY STRUCTURE AND CIRCUIT

TECHNICAL FIELD

The present invention relates to a three-dimensional memory structure and circuit, and more particularly to a connection structure between a drive circuit and a memory array in a three-dimensional memory.

DESCRIPTION OF RELATED ART

In the three-dimensional (3D) memory technology, as the density of the 3D memory increases and becomes more and more multi-layered, the height of the 3D memory array also increases. Therefore, it is necessary to reduce the thickness of the word lines (WL) in the manufacturing process to reduce the height of the memory array. However, reducing the thickness of the word line also increases the sheet resistance of the word lines. In addition, a large word line time constant (i.e., RC value) is not suitable for high-speed design of memory operations (read/program/erase).

In the existing technology, the word line driver of the memory array can use a configuration a side drive circuit, which can provide a smaller layout area, but this configuration will have a longer word line length and a larger word line time constant. As a result, the word line transient speed is slow. In addition, the existing technology can also use another configuration of a so-called middle drive circuit. Although this configuration has a larger layout area, but it has a shorter word line and a smaller word line time constant, which results in that the transient speed of the word line is faster. However, in some package types, the width of the drive circuit layout is limited, so that a higher block height of the memory is required. Generally, the drive circuit layout for one block of the memory requires 4 sub-blocks, but the configuration of the middle drive circuit will increase to 8 sub-blocks, thereby increasing the block density double.

In addition, more sub-blocks will also increase the word line transient power, which is supported by the high-voltage pump circuit. Therefore, the larger the word line transient power, the larger the high-voltage pump circuit. However, the size of the die will limit the size of the high-voltage pump circuit. If the high-voltage pump circuit cannot fully support the word line transient power, the word line transient speed is not only limited by the word line time constant, but also affected by the output ability of the high-voltage pump circuit. This will cause the word line transient speed to become slower.

In this way, the advantage of the middle drive circuit does not exist. This will cause the drive circuit to become larger, thereby increasing the size of the die. In addition, a larger block size will also increase the power consumption of the word line transient. Also, the larger the block size and the smaller the number of blocks will also make the controller difficult to use. A large block size will also increase the failure rate of bad blocks.

FIG. 1A illustrates a schematic diagram of the connection relationship between the middle drive circuit and the selection lines/the word lines in a conventional memory structure. FIG. 1B is a schematic diagram illustrating the connection relationship in the vertical direction between the middle drive circuit and the selection lines/the word lines in a conventional memory structure. As shown in FIG. 1A, the memory structure 100 includes at least a first half-memory array 102a and a second half-memory array 102b (respectively having the same number of word lines), a first connection area 104a and a second connection area 104b, a first pass gate set 106a and a second pass gate set 106b, and a middle drive circuit 108.

As shown in FIGS. 1A and 1B, the first connection area 104a and the second connection area 104b are respectively connected to the first half-memory array 102a and the second half-memory array 102b, the first pass gate set 106a and the second pass gate set 106b are substantially arranged below the first connection area 104a and the second connection area 104b, respectively. Each of the pass gates in the first pass gate set 106a is connected to the corresponding selection lines SSL, GSL and the word lines WL0~WLN in the first memory half array 102a through the corresponding connection area in the first connection area 104a. Also, each of the pass gates in the second pass gate set 106b is connected to the corresponding selection lines SSL, GSL and the word lines WL0~WLN in the second memory half array 102b through the corresponding connection area in the second connection area 104b. The middle drive circuit 108 is arranged between and below the first half memory array 102a and the second half memory array 102b, and is connected to the first pass gate set 106a and the second pass gate set 106b. The first half of the memory array 102a and the second half of the memory array 102b is configured to be the entire memory array.

FIG. 2A shows a top view of a block structure of a 3D memory with a side drive circuit. FIG. 2B shows a top view of a block structure of a 3D memory with a middle drive circuit. As shown in the side drive circuit configuration in FIG. 2A, the drive circuit 120 is arranged on the side (one side of the memory array 134). Generally, a block of the memory array 134 includes 4 sub-blocks, one block corresponds to a pass gate set 132, and the block layout width of the pass gate set 132 is a.

As the middle drive circuit architecture shown in FIG. 2B, this configuration divides a memory array into two sub-arrays 134a, 134b, and the two sub-arrays 134a, 134b are half of the entire memory array 134 in size. In addition, the two sub-arrays are the same structure and have the same number of word lines. Because under this configuration, the sub-arrays 134a, 134b on each side are basically similar to the memory array 134 of FIG. 2A; therefore, if the structure of 4 sub-blocks in FIG. 1A is to be maintained, the layout widths of the respective pass gate set 132a and 132b of the sub-arrays 134a and 134b will also become a, but this will make the layout area width of the entire pass gate sets double and memory become larger. Therefore, it is better to reduce the width of the pass gate sets 132a and 132b to b, for example, to reduce the width by half. However, due to the width reduction, if not improve the total number of the pass gate, the height of the pass gate layout will become higher, and the increased space caused by the higher height will make the configuration of 4 sub-blocks of a block memory side be a configuration of 8 sub-blocks of a block memory side. In this way, the word lines are shared by the 4 sub-blocks will becomes to be shared by to the 8 sub-blocks, and thus the load of the pass gates will be heavier.

Therefore, this art needs to further develop a design to configure the middle drive circuit to achieve a smaller drive circuit, a higher word line transient speed, and a smaller number of sub-blocks per block.

SUMMARY

According to an embodiment of the invention, a three-dimensional memory structure is provided. The three-dimensional memory structure comprises a memory array, including a first sub-array and a second sub-array, each having a first selection line, a plurality of word lines, and a second selection line; a connection structure, including a plurality of connection areas, and at least one of extension structures of the first selection line, the plurality of word lines, and the second selection line is coupled to a corresponding connection area of the plurality of connection areas; a pass gate set, arranged under the connection structure and between the first sub-array and the second sub-array, wherein the pass gate set includes a plurality of pass gates, and the plurality of word lines and the second selection line, and the plurality of pass gates are respectively coupled to the corresponding plurality of connection areas; and a drive circuit, coupled to the pass gate set, and disposed under the connection structure.

According to another embodiment of the invention, a three-dimensional memory circuit is provided. The three-dimensional memory circuit comprises a memory array includes a first sub-array and a second sub-array, each having a first selection line, a plurality of word lines, and a second selection line, wherein there are a plurality of blocks in memory, each block including a plurality of sub-blocks, and in each sub-block, at least one of the first selection lines, the plurality of word lines and the second selection lines of the first sub-array and the second sub-array is coupled to each other; a drive circuit, provided under the memory array and between the first and second sub-arrays for driving the first sub-array and the second sub-array; and a plurality of pass gates, coupled to the driving circuit, for transmitting control signals of the drive circuit to the first and second sub-arrays through the plurality of pass gates. The plurality of pass gates is respectively coupled upwards to extension structures of the corresponding first selection line, the plurality of word lines and the second selection line through a plurality of connection areas, and is arranged under the plurality of connection areas.

BRIEF DESCRIPTION OF THE DRAWINGS

FIG. 2A shows a top view of one block structure of the 3D memory with a side drive circuit.

FIG. 2B shows a top view of one block structure of the 3D memory with a middle drive circuit.

DESCRIPTION OF THE EMBODIMENTS

In the embodiment of the present invention, a 3D memory structure is provided for a middle drive circuit, which does not increase the number of pass gates, not increase the number of sub-blocks in a block of the memory which is the same as the memory which use the side drive circuit. Hereinafter, the memory will be referred to as 3D memory for short.

Figure 1A:
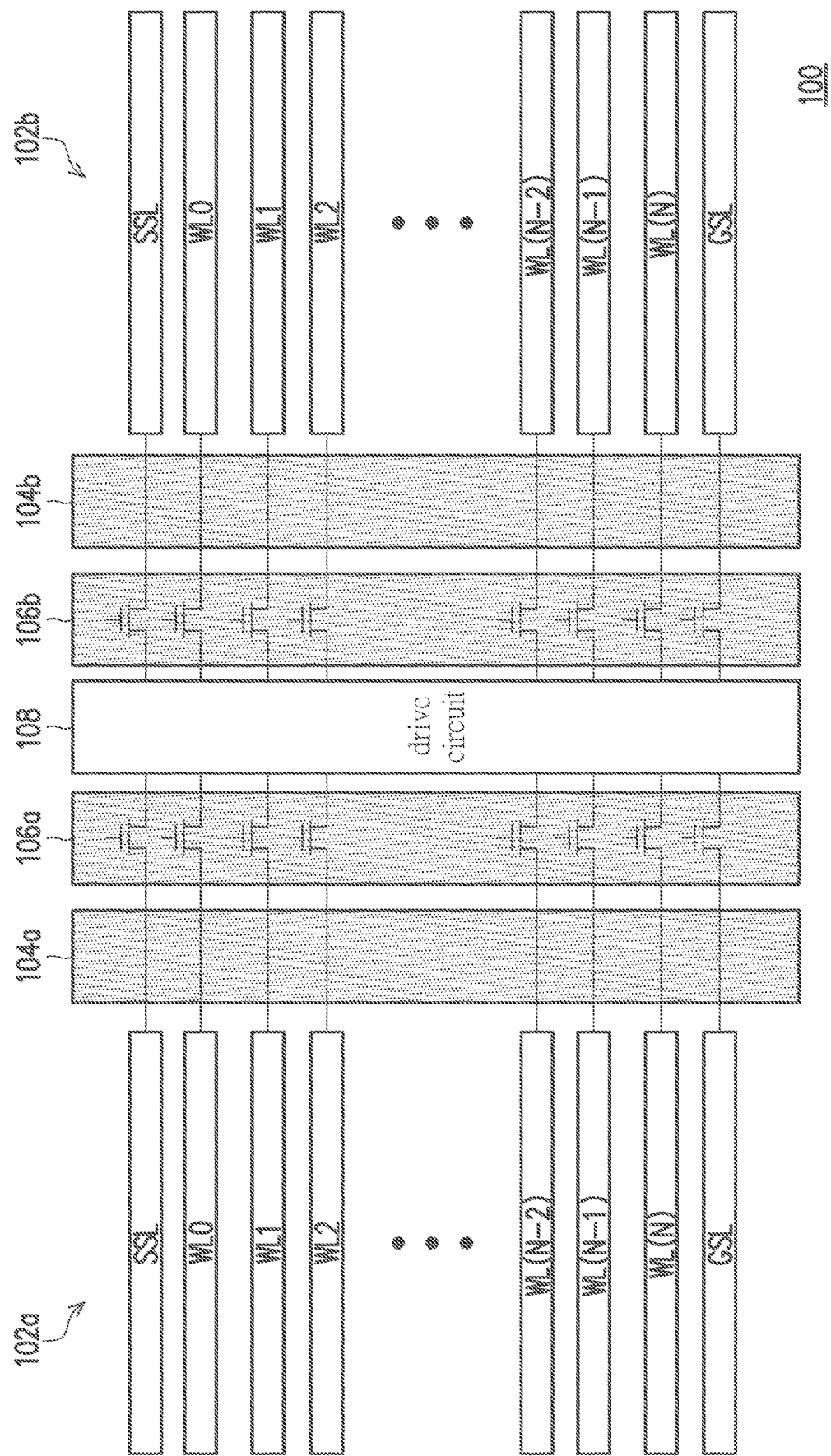
FIG. 1A shows a schematic diagram of the connection relationship between the selection line and the word lines of the 3D memory and the middle drive circuit in the related art.
Figure 1B:
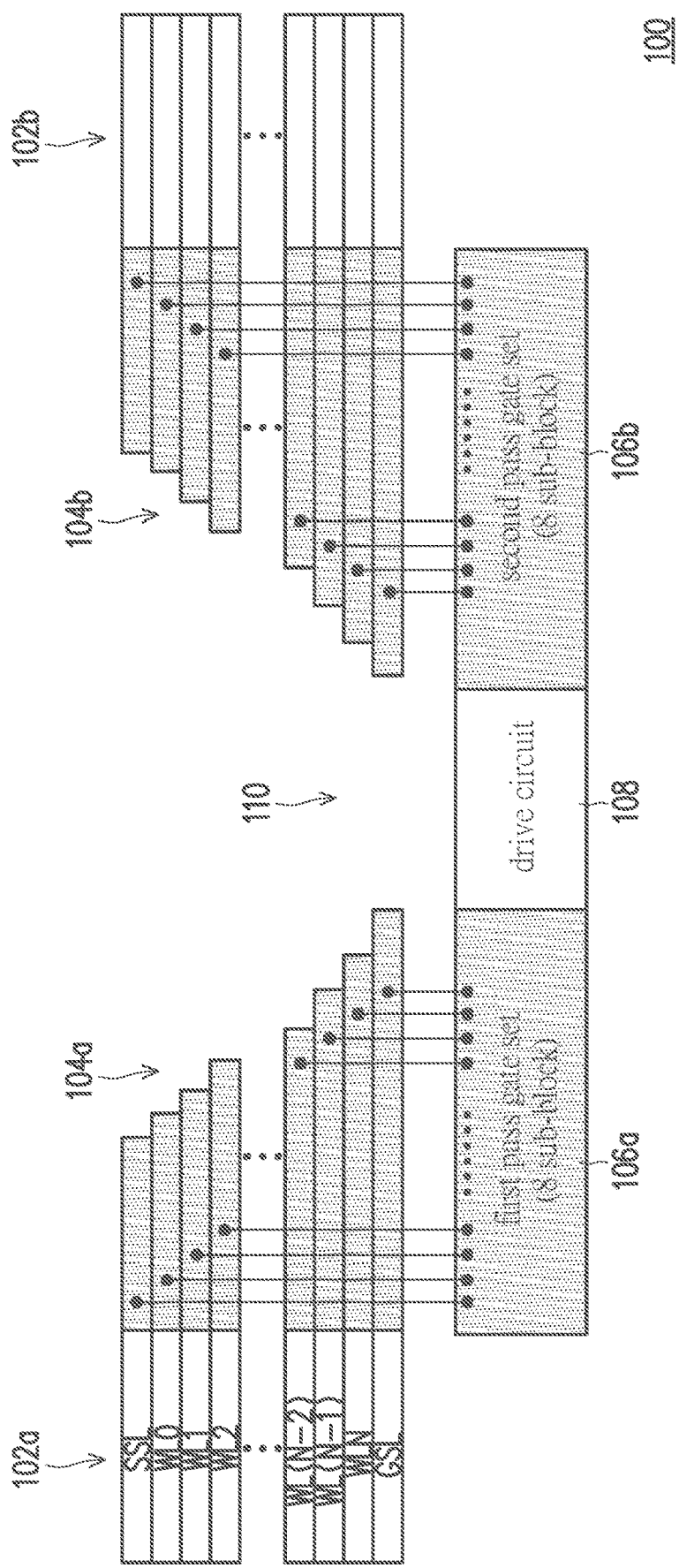
FIG. 1B is a schematic diagram showing the connection relationship in the vertical direction between the selection line and the word lines of the 3D memory and the middle drive circuit in the related art.
Figure 3:
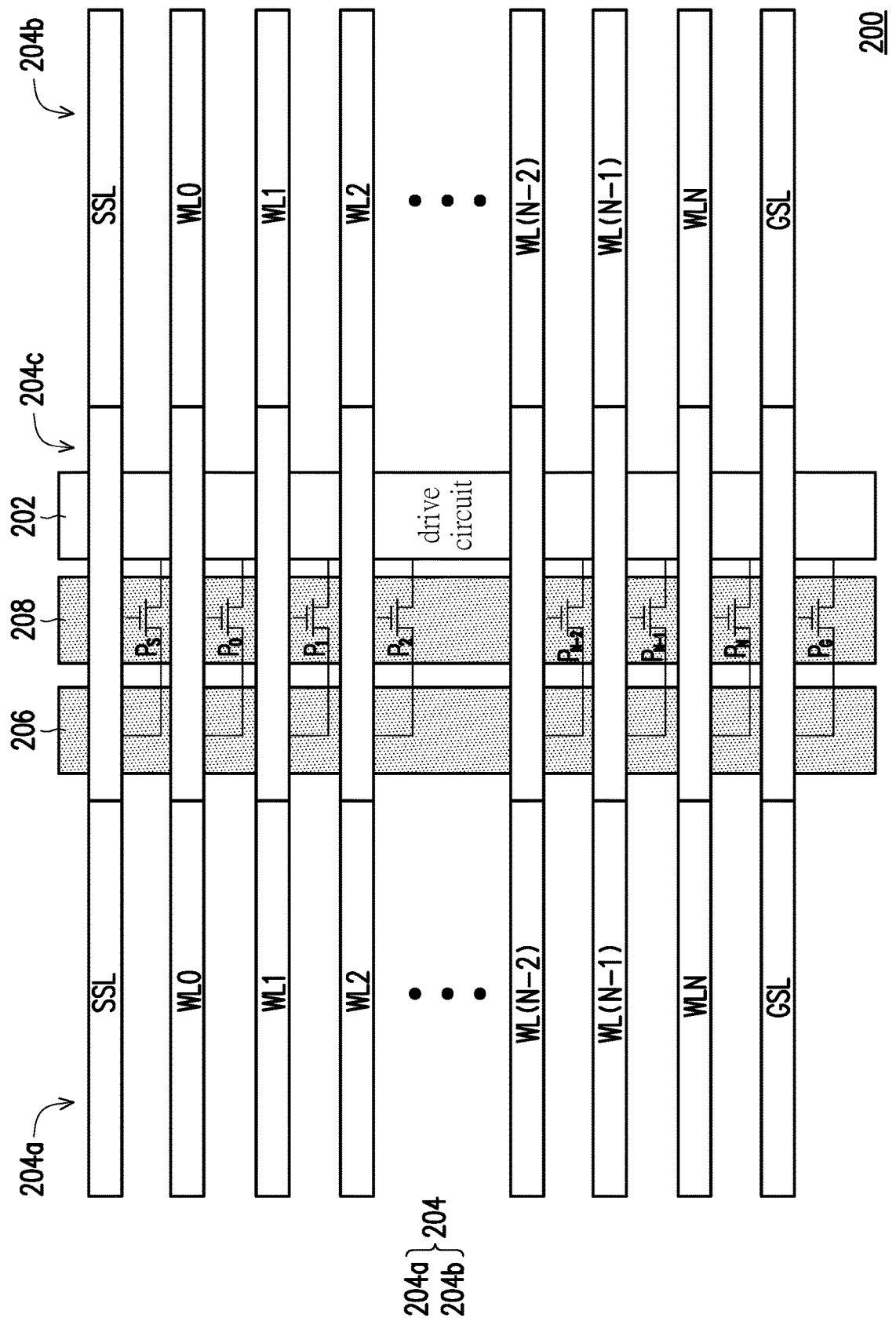
FIG. 3 is a conceptual diagram of a 3D memory structure according to an embodiment of the invention.

FIG. 3 is a schematic diagram of a memory structure according to an embodiment of the present invention. As illustrated in FIG. 3, the 3D memory structure 200 includes a memory array 204, a middle drive circuit (referred to drive circuit below) 202, a connection structure 206, and a pass gate set 208. The memory array 204 further includes a first sub-array 204a and a second sub-array 204b.

According to an embodiment of the invention, both the first sub-array 204a and the second sub-array 204b configures a complete memory array 204, and each of the first sub-array 204a and the second sub-array 204b has a selection line (first selection line) SSL, a word lines WL0~WLN and a selection line (second selection line) GSL. In an example, the first sub-array 204a and the second sub-array 204b may equally divide the memory array 204 into two, sub-arrays that is, the first sub-array 204a and the second sub-array 204b have the same number of word line, and only the number of memory cells are half of the memory array 204. In this embodiment, the numbering of the word lines WL0~WLN is sequentially numbered from high to low in the vertical direction of the memory array 204, but can be also numbered reversely.

In addition, in the first sub-array 204a and the second sub-array 204b, two corresponding selection lines SSL, two corresponding word line WL0~WLN, and two corresponding selection lines GSL are shorted or coupled to each other through non-cutting areas 204c. For example, the selection line SSL of the first sub-array 204a is connected to the selection line SSL of the second sub-array 204b through the SSL corresponding portion of the non-cutting areas 204c, the selection line GSL of the first sub-array 204a is connected to the selection line GSL of the second sub-array 204b through the GSL corresponding portion of the non-cutting areas 204c, the word line WLi (i=0~N) of the first sub-array 204a is connected to the word line WLi of the second sub-array 204b through the WLi corresponding portion of the non-cutting areas 204c.

In addition, for example, the memory array 204 of the 3D memory structure 200 in this embodiment is referred to a block, and under a general specification, one block usually includes 4 sub-blocks. The memory array of each sub-block includes a selection line SSL, word lines WL0~WLN, and a selection line GSL. In operation, the selection lines SSL and GSL are first used to select one of the sub-blocks, and then select the word lines. Therefore, one pass gate set 206 can be shared by the 4 sub-blocks.

The 3D memory structure 200 further includes a connection structure 206, which includes a plurality of connection areas. The connection structure 206 is arranged side by side with the first sub-array 204a and the second sub-array 204b. The number of the plural connection areas of the connection structure 206 is the same as the sum of the number of word lines, the number of selection lines SSL and GSL, and corresponds to each other one by one. In other words, each of the word lines WL0 to WLN, the selection line SSL and the selection line GSL corresponds to a connection area. These connection areas provide each of the word lines WL0~WLN, the selection line SSL, and the selection line GSL to be connected downward to the corresponding pass gates $P_S$, $P_0$~$P_N$, and $P_G$ in the pass gate set 208. The pass gates $P_S$, $P_0$~$P_N$, and $P_G$ can be configured by MOS transistors. The plural connection areas of the connection structure 206 may be connected to each of the word lines WL0~WLN, the selection line SSL and the selection line GSL, respectively. Thereby, the drive circuit 202 can transmit control signals to the selected word lines and the selection lines through the pass gate to drive the memory cells (not shown) on the selected word lines.

The drive circuit 202 is arranged under the connection structure 206, and in one embodiment can be further arranged between the first sub-array 204a and the second sub-array 204b. The drive circuit 202 can drive the first sub-array 204a and the second sub-array to perform related operations, such as read, program and erase. The pass gate set 208 is disposed under the connection structure 206.

In addition, according to this embodiment, only one pass gate set 206 is provided, the number of which at least corresponds to the selection line SSL, the word lines WL0~WLN and the selection line GSL. According to the embodiment, although a configuration of the middle drive circuit is used, the embodiment does not need to use two pass gate sets as the configuration of the prior art which are provided to the first sub-array 204a and the second sub-array 204b, respectively. In addition, the pass gate set 208 is arranged below the connection structure 206. It should be noted that although FIG. 3 depicts the pass gate set 208 next to the connection structure 206, but it is only a conceptual schematic diagram for the convenience of understanding this embodiment only using one pass gate set group 208. In order to achieve the technical effect of the invention, one pass gate set 208 can have different configurations, which will be further described below.

Figure 4:
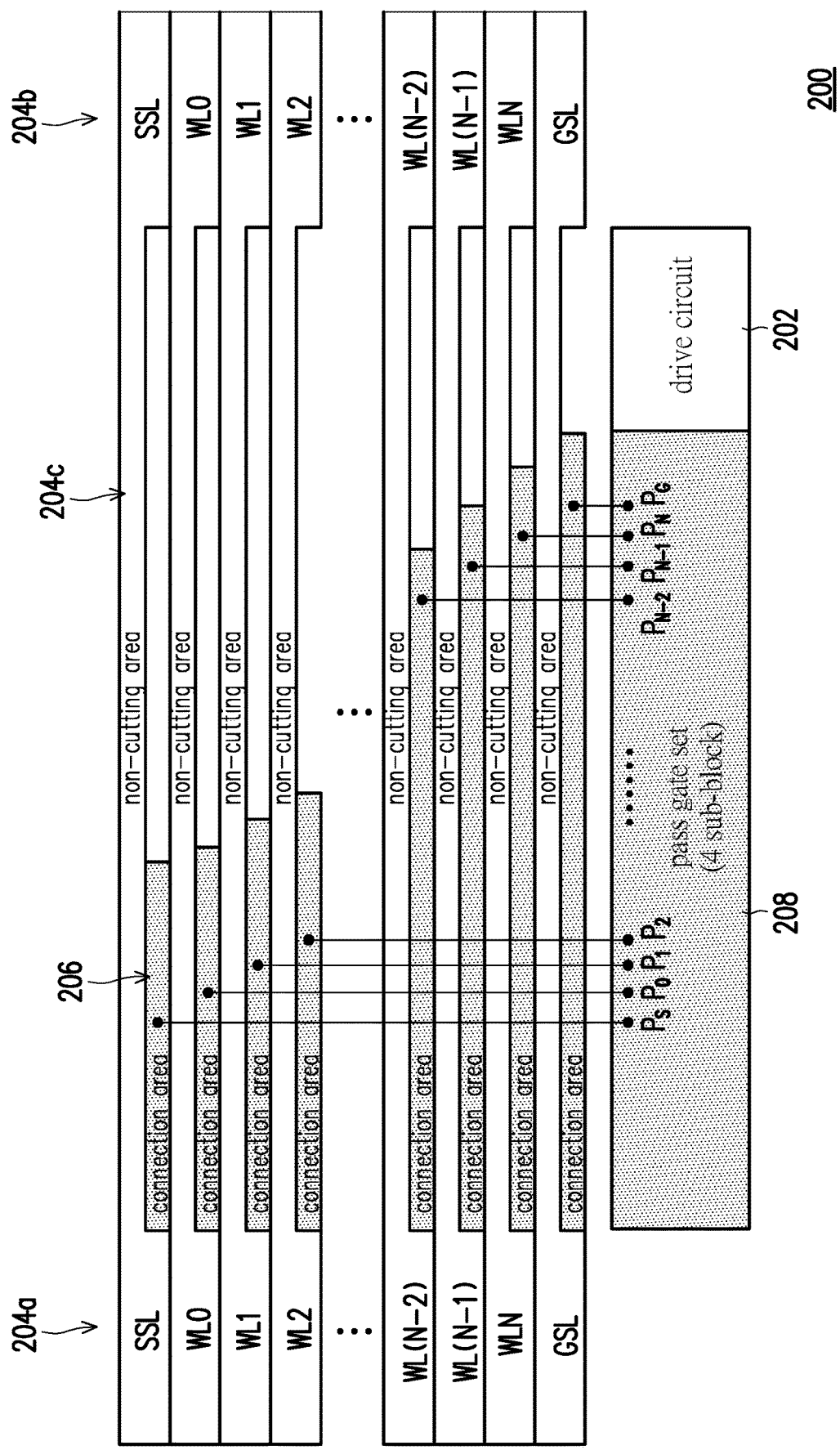
FIG. 4 illustrates a schematic connecting-view diagram of a 3D memory structure according to an embodiment of the invention.

FIG. 4 illustrates a schematic diagram of a 3D memory structure according to an embodiment of the invention. FIG. 4 is a 45° side view (vertical direction) of the 3D memory structure 200, which is an exemplary embodiment of the conceptual diagram of FIG. 3. Each non-cutting area (i.e., extension structure) 204c is in the same height as each connection areas 206 of each word line WL0~WLN. The 3D memory 200 has a drive (middle drive) circuit 202, and is disposed under the connection area 206 and between the first sub-array 204a and the second sub-array 204b. Each of the first sub-array 204a and the second sub-array 204b includes a selection line (first selection line, there is one SSL for each sub-block) SSL, word lines WL0~WLN, and a selection line (second selection line, there is one GSL for each sub-block) GSL.

In addition, the selection line SSL, the word lines WL0~WLN and the selection line GSL of the first sub-array 204a and the second sub-array 204b are connected by the non-cutting areas 204c, respectively; namely, the selection line SSL of the first sub-array 204a and the second sub-array 204b are shorted or coupled to each other, the word lines WLi (i=0~N) of the first sub-array 204a and the second sub-array 204b are shorted or coupled to each other, the selection lines GSL of the first sub-array 204a and the second sub-array 204b are also shorted or coupled to each other. Although not shown, the selection line SSL, the word lines WL0~WLN, and the selection lines GSL can be isolated by insulating materials.

The 3D memory structure 200 further includes a connection structure 206, which includes a plurality of connection areas. The number of the plural connection areas is the same as the total number of the selection line SSL, the word lines WL0~WLN and the selection line GSL. Each connection area in the connection structure 206 corresponds one-by-one to the selection line SSL, the word lines WL0 to WLN and the selection line GSL. In this embodiment, each connection area extends from the first sub-array 204a to the second sub-array 204b (or vice versa). Each of connection areas is connected to the corresponding selection line SSL, word lines WL0~WLN and selection line GSL of the first sub-array 204a. In another embodiment, each of connection areas is not connected to the corresponding selection line SSL and word lines WL0~WLN and selection line GSL of the second sub-array 204b. Namely, each of connection areas is only connected to the selection line SSL and the word lines WL0~WLN and the selection line GSL of the first sub-array 204a or the second sub-array 204b.

The plural connection areas of the connection structure 206 are stacked in the vertical direction of the memory array 204. As an example, the plural connection areas can be stacked in a step shape to facilitate the wiring connection to the pass gate set 208 below.

The pass gate set 208 is coupled to the drive circuit 202, and various control signals of the drive circuit 202 can be transmitted to the selected word line through each pass gate of the pass gate set 208. In this embodiment, the pass gate set 208 is disposed under the connection structure 206. The pass gate set 208 may comprise a plurality of pass gates $P_S$, $P_0$~$P_N$, $P_G$. The number of the pass gates $P_S$, $P_0$~$P_N$, $P_G$ is at least the same as the number of the connection areas of the connection structure 206. In general, the pass gates $P_S$, $P_0$~$P_N$, $P_G$ can be formed by MOS transistors. The pass gates $P_S$, $P_0$~$P_N$, $P_G$ are one-to-one connected to the corresponding connection areas of the connection structure 206 by wirings or other possible methods.

In the embodiment, the corresponding selection line SSL, word line WL0~WLN and selection line GSL are coupled to each other and one pass gate set is used. Therefore, in the configuration described above, even though a configuration of the middle drive circuit is adopted, the entire memory array 204 only needs one pass gate set 208 to allow the first sub-array 204a and the second sub-array 204b to be used at the same time, instead of requiring two pass gate sets like the related art. In addition, one block can still maintain to include 4 sub-blocks. Therefore, the block height of the memory array 204 is not increased. In this way, the load of the drive circuit and the pass gates of the pass gate set will not be too large.

Figure 5:
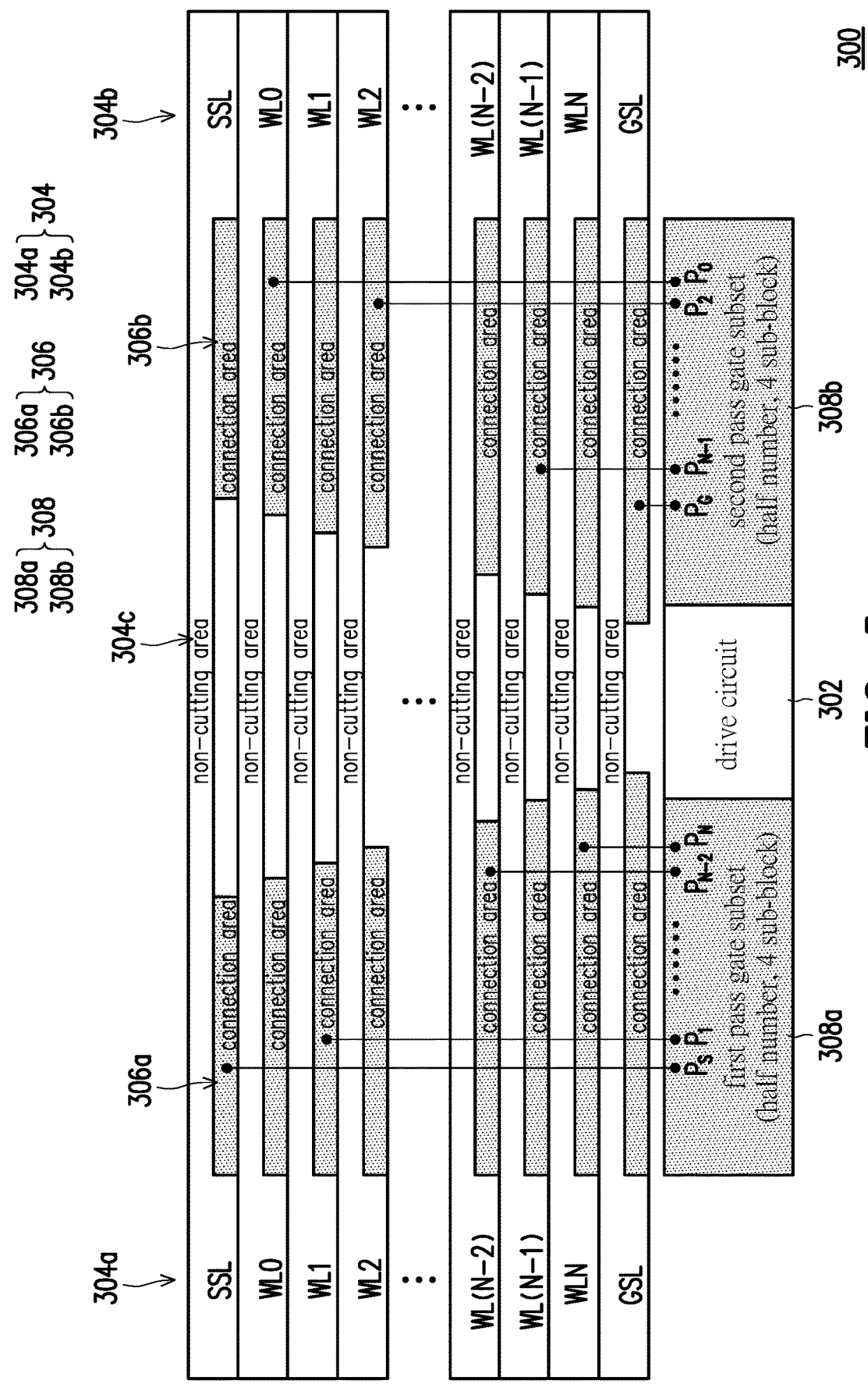
FIG. 5 is a schematic connecting-view diagram of a 3D memory structure according to an embodiment of the invention.

FIG. 5 is a schematic diagram of a 3D memory structure according to an embodiment of the invention. As shown in FIG. 5, similarly, the 3D memory 300 has a drive (middle drive) circuit 302, and is disposed under the connection structure 306 and between the first sub-array 304a and the second sub-array 304b. Each of the first sub-array 304a and the second sub-array 304b includes a selection line SSL, word lines WL0~WLN, and a selection line GSL.

The selection line SSL, the word lines WL0~WLN and the selection line GSL of the first sub-array 304a and the second sub-array 304b are connected by the non-cutting area 304c, respectively; namely, the selection line SSL of the first sub-array 304a and the second sub-array 304b are shorted or coupled to each other, the word line WLi (i=0~N) of the first sub-array 304a and the second sub-array 304b are shorted or coupled to each other, the selection lines GSL of the first sub-array 304a and the second sub-array 304b are also shorted or coupled to each other. Although not shown, the selection line SSL, the word lines WL0~WLN and the selection line GSL can be isolated by insulating materials.

In this embodiment, the 3D memory structure 300 further includes a connection structure 306, and the connection member 306 further includes a first connection structure 306a and a second connection structure 306b. The first connection structure 306a and the second connection structure 306b each include a plurality of connection areas. The number of the plurality of connection areas of each of the first connection structure 306a and the second connection member 306b is the same as the total number of the selection line SSL, the word lines WL0~WLN and the selection line GSL. Each connection area of the first connection member 306a is one-to-one corresponding to and is coupled to each of non-cutting areas (extension structure) 304c of the selection line SSL, the word lines WL0~WLN and the selection line GSL of the first sub-array 304a. Each connection area of the second connection member 306b is one-to-one corresponding to and is coupled to each of non-cutting areas (extension structures) 304c of the selection line SSL, the word lines WL0~WLN and the selection line GSL of the second sub-array 304b. Here, the one-to-one configurations are an example, not to limit the invention.

In this embodiment, the plural connection areas of the first and second connection members 306a and 306b are stacked in the vertical direction of the memory array 304. As an example, the plural connection areas can be stacked in a step shape to facilitate the wiring connection to the pass gate set 308 underneath.

In addition, in the 3D memory structure 300 illustrated in FIG. 5, the pass gate set 308 is further divided into two subsets. Therefore, the pass gate set 308 of this embodiment includes a first pass gate subset 308a and a second pass gate subset 308b. The first pass gate subset 308a is used for example by the selection line SSL and the odd-numbered word lines WL of the first sub-array 304a and connected to the second sub-array 304b by non-cutting area, and the second pass gate subset 308b is used for example by the even word lines WL and the selection line GSL of the second sub-array 304b and connected to the first sub-array 304a by non-cutting area.

The first pass gate subset 308a and the second pass gate subset 308b are coupled to the drive circuit 302 respectively, and various control signals of the drive circuit 302 can be transmitted to the selected word line of the first or the second sub-arrays 304a, 304b through each pass gate of the first and second pass gate subset 308a, 308b. In this embodiment, the first and the second pass gate subsets 308a, 308b are respectively disposed below the first and the second connection structure 306a, 306b, i.e., below the memory array 304, and are disposed at two sides of the drive circuit 302.

The first and second pass gate subsets 308a, 308b comprises a plurality of pass gates respectively, and the total number of pass gates $P_S$, $P_0$~$P_N$, $P_G$ of the first and second pass gate subsets 308a, 308b is at least the same as the total number of the selection line SSL, the word lines WL0~WLN and the selection line GSL of the first sub-array 304a (or the second sub-array 304b). Similarly, the pass gates $P_S$, $P_0$~$P_N$, $P_G$ can be formed by MOS transistors. In this embodiment, the first and the second pass gate subsets 308a and 308b respectively have the same number of the pass gates. For example, the first pass gate subset 308a is provided with the pass gates $P_S$, P1, ..., $P_{N-2}$, $P_N$, and the second pass gate subset 308b is provided with the pass gates $P_0$, P2, ..., $P_{N-1}$, $P_G$. In other words, the pass gates $P_S$, P1, ..., $P_{N-2}$, $P_N$ provided in the first pass gate subset 308a are connected upwards by wiring or other method to the selection line SSL and the odd-numbered word lines WL1, WL3 ..., WL(N-2), WLN of the first sub-array 304a via the corresponding connection areas of the first connection structure 306a. In addition, the pass gates $P_0$, P2, ..., $P_{N-1}$, $P_G$ provided in the second pass gate subset 308b are connected upwards by wiring or other method to the selection line GSL and the even-numbered word lines WL0, WL2 ..., WL(N-1) of the second subarray 304b via the corresponding connection areas of the second connection member 306b.

As described above, in this embodiment, because the number of the first pass gate subset 308a is only half of the pass gate set 208 in FIG. 4, and thus only half of the connection areas in the first connection structure 306a will be used. Namely, through the connection areas of the first connection member 306a that are respectively corresponding to the selection line SSL and the odd-numbered character lines WL1, WL3, ..., WL(N-2), WLN of the first sub-array 304a, each of the pass gates of the first pass gate subset 308a can be connected upwards to the corresponding selection line SSL and the odd-numbered word lines WL1, WL3, ... WL(N-2), WLN. Similarly, through the connection areas of the second connection structure 306b corresponding to the even-numbered word lines WL0, WL2, ..., WL(N-1) and the selection line GSL of the second sub-array 304b, each of the pass gates of the second pass gate subset 308b can be connected upwards to the corresponding selection line GSL and even-numbered word lines WL0, WL2, ..., WL(N-1).

Therefore, under the middle drive circuit configuration, two connecting structures 306a, 306b are provided respectively for the two sub-arrays 304a, 304b of the memory array 304. However, in this embodiment, the selection lines SSL, the word lines WL0~WLN, and the selection lines GSL of the two sub-arrays 304a and 304b are shorted or coupled by the non-cutting areas 304c respectively, and moreover, one pass gate subset is divided into two subsets, so this embodiment can still use one pass gate set to drive the first sub-array 304a and the second sub-array 304b, which does not use two pass gate sets like the existing technology. Therefore, one block can still maintain 4 sub-blocks. In this way, the load of the drive circuit and the pass gates of the pass gate set will not be too large.

Figure 6:
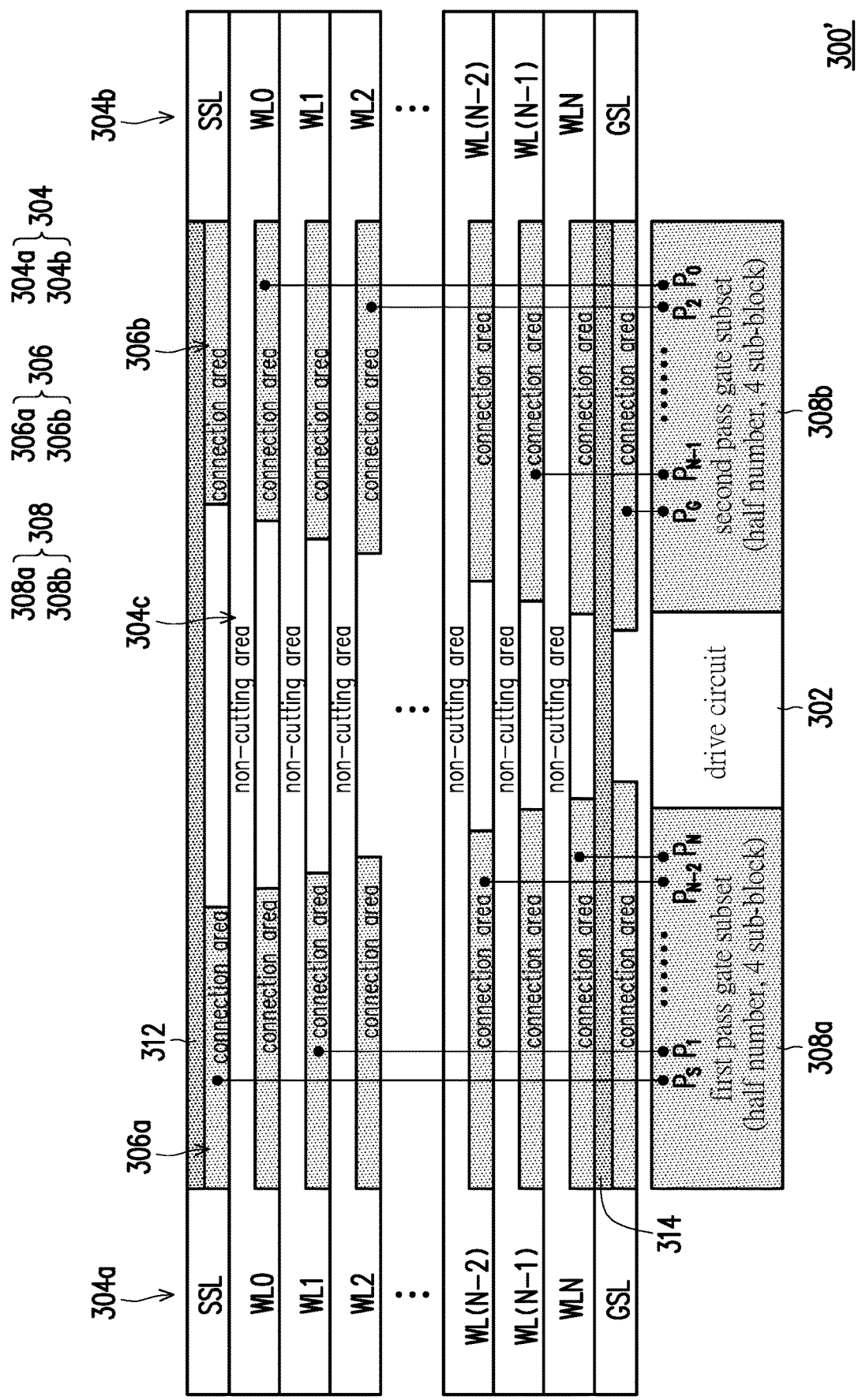
FIG. 6 is a schematic connecting-view diagram showing a variation of the 3D memory structure of FIG. 5.

FIG. 6 is a schematic diagram showing a variation of the 3D memory structure of FIG. 5. In this variation, the same components in the 3D memory structure 300' are labelled with the same reference numerals, and the corresponding descriptions will not be repeated. In the embodiment of the invention, the selection lines SSL, the word lines WL0 to WLN, and the selection lines GSL of the first sub-array 304a and the second sub-array 304b are coupled by the non-cutting areas 304c respectively. In the 3D memory structure shown in FIG. 4 or FIG. 5, because the number of the word lines is very large, it is impractical to additionally use wires or metal layers for connection. Therefore, the non-cutting areas 204c or 304c are usually formed by the same material of the word line itself in the manufacturing process, and then the connection is achieved without cutting the word line between the two sub-arrays. For example, the respective word lines of the first sub-array 304a and the second sub-array 304b can be formed at the same time, and then the word lines between the first sub-array 304a and the second sub-array 304b will not be cut, so that the corresponding word lines of the first sub-array 304a and the second sub-array 304b can be coupled to each other. The non-cutting areas for the selections SSL and GSL can be formed in the same way.

However, for the selection lines SSL and GSL, because one block usually has 4 sub-blocks, and therefore, there are 4 selection lines SSL and 4 selection lines GSL. Therefore, in the variation illustrated in FIG. 6, the non-cutting areas 312 and 314 between the selection lines SSL and between the selection lines GSL of the first sub-array 304a and the second sub-array 304b can be connected using different methods or materials, such as metal layers, wires or different materials.

Figure 7:
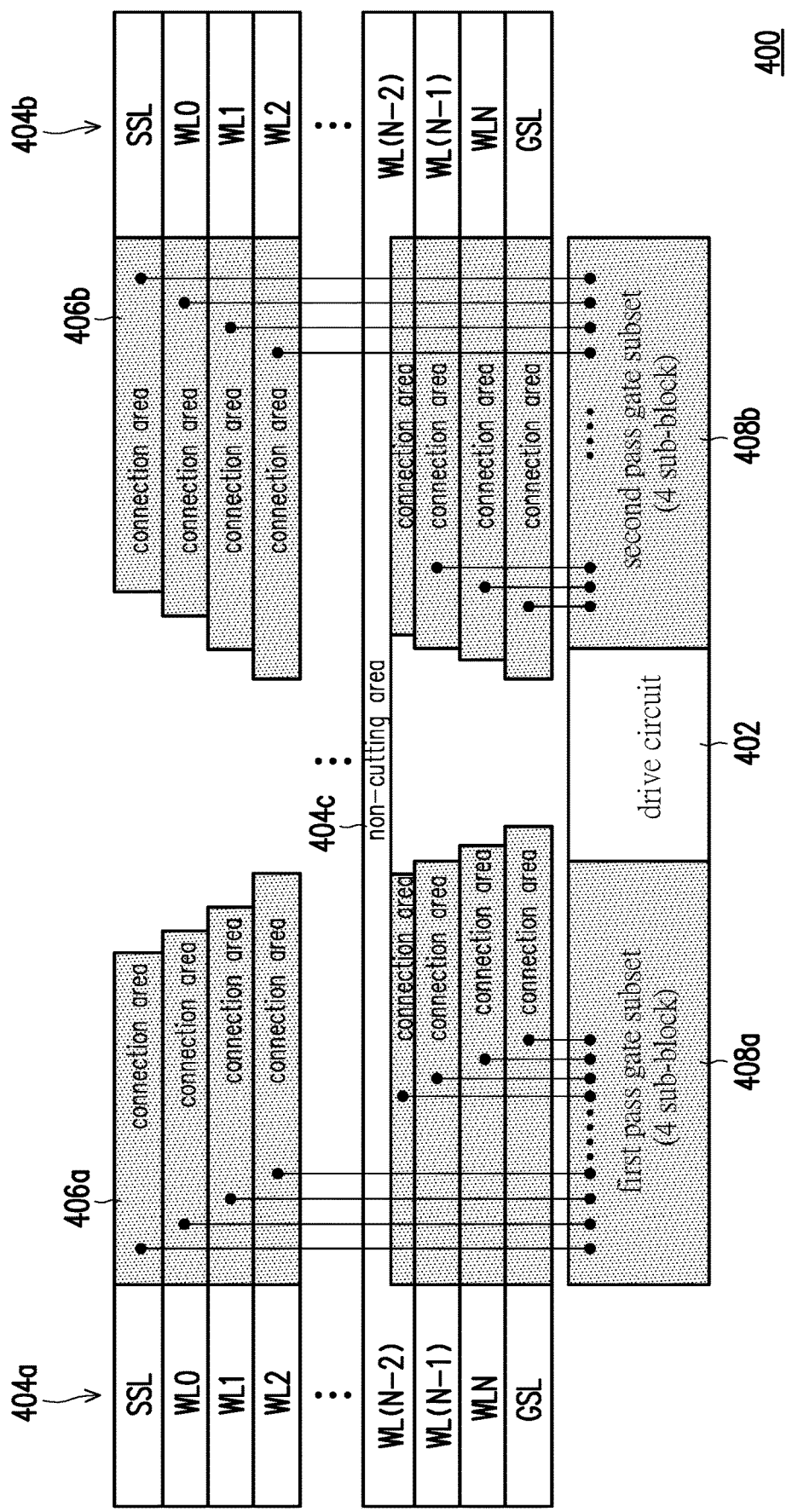
FIG. 7 illustrates a schematic connecting-view diagrams of a 3D memory structure according to another embodiment of the invention.

FIG. 7 illustrates a schematic diagram of a 3D memory structure according to another embodiment of the invention. The memory structure 400 is basically similar to the structure shown in FIG. 5, and also includes a memory array 404 having a first sub-array 404a and a second sub-array 404b, a connection structure 406 having a first connection structure 406a and a second connection structure 406b, a pass gate set 408 having a first pass gate subset 408a and a second pass gate subset 408b and a drive circuit 402. The structure of these components is the same as that of FIG. 5, and their corresponding descriptions will not be described in details. The pass gates of the first pass gate subset 408a are respectively coupled to the connection areas of the first connection structure 406a corresponding to the selection line SSL, the word lines WL0~WL(N−1) and the selection line GSL of the first sub-array 404a, and the pass gates of the second pass gate subset 408b are respectively coupled to the connection areas of the second connection structure 406b corresponding to the selection line SSL, the word lines WL0~WL(N−1) and the selection line GSL of the second sub-array 404b. However, because the word lines WL (N−2) of the first sub-array 404a and the second sub-array 404b is connected by the non-cutting area 404c, there is only one pass gate for WL(N−2) and provided in one pass gate subset (first pass gate subset 408a for example).

The difference between this embodiment and the embodiment shown in FIG. 5 is the arrangement of the non-cutting areas 404c. In the above embodiments of FIGS. 4 to 6, the corresponding selection lines SSL, word lines WL0 to WLN, and selection lines GSL of the first sub-array and the second sub-array are shorted or coupled by the non-cutting areas. However, in this embodiment, all of these lines may not be necessary to be coupled to each other, and only at least one of the selection lines SSL, the word lines WL0~WLN, and the selection lines GSL may be coupled to each other. Even though only a portion of the selection lines SSL, the word lines WL0 to WLN, and the selection lines GSL are coupled to each other, a certain technical effect for reducing the pass gates can be achieved.

In the above-mentioned embodiment, the memory array is divided into two sub-arrays with the same size, but different way of dividing the memory array may be used based on the demands. In addition, in the memory structure of FIG. 5, the connection between the two sub-arrays and the pass gates of the two pass gate subsets are arranged by the selection lines and the odd-numbered and even-numbered word lines, but the connection may be also arranged based on the sequence of the selection lines and the word lines. For example, if there are 0~N word lines (N, j are natural numbers, j<N), the pass gates of the first pass gate subset can be respectively coupled to the first selection line and the 0-th to j-th word lines of the first sub-array, and the pass gates of the second pass gate subset can be respectively coupled to the second selection line and the (j+1)-th to N-th word lines of the second sub-array.

In summary, according to the embodiment of the invention, when the 3D memory structure adopts the configuration of middle drive circuit, the selection lines and the word lines of the two sub-arrays are respectively coupled to each other, and only one set of pass gates is used. One pass gate set has pass gates of the same number as the selection lines and word lines, so there is no need to use two pass gate sets as the prior art. Moreover, the memory array of one block can still be maintained to be 4 sub-blocks without increasing up to 8 sub-blocks like the prior art. In this way, the load of the drive circuit and the pass gates of the pass gate set will not be too large.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional memory structure, comprising:
   a memory array, including a first sub-array and a second sub-array, each having a first selection line, a plurality of word lines, and a second selection line;
   a connection structure, including a plurality of connection areas, and at least one of extension structures of the first selection line, the plurality of word lines, and the second selection line is coupled to a corresponding connection area of the plurality of connection areas, wherein each of the plurality of connection areas extends from the first sub-array to the second sub-array, and each of the extension structure is a non-cutting area, and the first selection line, the plurality of word lines, and the second selection line of the first sub-array are respectively coupled to the first selection line, the plurality of word lines and the second selection line of the second sub-array through each of the extension structures;
   a pass gate set, arranged under the connection structure and between the first sub-array and the second sub-array, wherein the pass gate set includes a plurality of pass gates, and the plurality of pass gates are respectively coupled to the corresponding plurality of connection areas; and
   a drive circuit, coupled to the pass gate set, and disposed under the connection structure.

2. The three-dimensional memory structure according to claim 1, wherein a number of the plurality of pass gates is at least the same as a total number of the first selection line.

3. The three-dimensional memory structure according to claim 1, wherein the memory array includes a plurality of blocks and each of the plurality of blocks includes a plurality of sub-blocks, and
   for each sub-block, one of the first selection line, the plurality of word lines and the second selection line of the first sub-array and the second sub-array is coupled to each other.

4. The three-dimensional memory structure according to claim 1, the first selection line, the plurality of word lines, and the second selection line of the first sub-array are respectively coupled to the first selection line, the plurality of word lines and the second selection line of the second sub-array through each of the extension structures.

5. The three-dimensional memory structure according to claim 4, wherein the plurality of connection areas of the connection structure is respectively coupled to each of the extension structures of the first selection line, the plurality of word lines and the second selection line of the first sub-array, and extends toward the second sub-array.

6. The three-dimensional memory structure according to claim 5, wherein the plurality of connection areas of the connection structure is stacked in a vertical direction of the memory array.

7. The three-dimensional memory structure according to claim 6, wherein the plurality of connection areas of the connection structure is stacked in a step shape.

8. The three-dimensional memory structure according to claim 4, wherein the connection structure further includes a first connection structure and a second connection structure, and the first connection structure has a plurality of first connection areas, the second connection structure has a plurality of second connection areas,
- a number of the plurality of first connection areas is the same as the total number of the first selection line, the plurality of word lines and the second selection line of the first sub-array, and a number of the plurality of second connection areas is the same as the total number of the first selection line, the plurality of word lines and the second selection line of the second sub-array,
- the pass gate set further includes a first pass gate subset and a second pass gate subset, and the first and the second pass gate subsets respectively have half of the number of the plurality of pass gates,
- the first selection line and odd-numbered word lines among the plurality of word lines of the first sub-array are respectively coupled to each of the pass gates of the first pass gate subset through the corresponding first connection areas of the first connection structure, and
- even-numbered word lines among the plurality of word lines and the second selection line and of the second sub-array are respectively coupled to each of the pass gates of the second pass gates subset through the corresponding second connection areas of the second connection structure.

9. The three-dimensional memory structure according to claim 8, the plurality of first connection areas of the first connection structure and the plurality of second connection areas of the second connection structure are stacked in a vertical direction of the memory array.

10. The three-dimensional memory structure according to claim 8, wherein the first and second connection areas of the first and second connection structure are stacked in a step shape.

11. The three-dimensional memory structure according to claim 4, wherein the connection structure further includes a first connection structure and a second connection structure, and the first connection structure has a plurality of first connection areas, the second connection structure has a plurality of second connection areas,
- a number of the plurality of first connection areas is the same as the total number of the first selection line, the plurality of word lines and the second selection line of the first sub-array, and a number of the plurality of second connection areas is the same as the total number of the first selection line, the plurality of word lines and the second selection line of the second sub-array,
- the pass gate set further includes a first pass gate subset and a second pass gate subset, and the first and the second pass gate subsets respectively have half of the number of the plurality of pass gates,
- the first selection line and a 0-th to a j-th word lines among the plurality of word lines of the first sub-array are respectively coupled to each of the pass gates of the first pass gate subset through the corresponding first connection areas of the first connection structure, and
- a (j+1)-th to an N-th word lines among the plurality of word lines and the second selection line of the second sub-array are respectively coupled to each of the pass gates of the second pass gates subset through the corresponding second connection areas of the second connection structure, wherein the plurality of word lines is the 0-th to the N-th word lines, N and j are natural numbers, and j<N.

12. The three-dimensional memory structure according to claim 4, wherein the first selection line, the plurality of word lines and the second selection line between the first sub-array and the second sub-array are respectively coupled to each other by each of the extension structures of a same material as the first selection line, the plurality of word lines and the second selection line.

13. The three-dimensional memory structure according to claim 4, wherein, the plurality of word lines between the first sub-array and the second sub-array are coupled by each of the extension structures of a same material as the plurality of word lines, and
- at least one of the first selection line and the second selection line between the first sub-array and the second sub-array is coupled with different materials.

14. The three-dimensional memory structure according to claim 13, wherein the different materials include metal layers or wires of materials different from the first and second selection lines.

15. The three-dimensional memory structure according to claim 1, wherein the first sub-array and the second sub-array have the same or different size.

16. The three-dimensional memory structure according to claim 1, wherein a number of the plurality of sub-blocks is 4.

17. A three-dimensional memory circuit, comprising:
- a memory array includes a first sub-array and a second sub-array, each having a first selection line, a plurality of word lines, and a second selection line, wherein the memory array includes a plurality of blocks each of which includes a plurality of sub-blocks, and in each sub-block, at least one of the first selection lines, the plurality of word lines and the second selection lines of the first sub-array and the second sub-array is coupled to each other;
- a drive circuit, provided under the memory array for driving the first sub-array and the second sub-array; and
- a plurality of pass gates, coupled to the drive circuit, for transmitting control signals of the drive circuit to the first and second sub-arrays through the plurality of pass gates,
- wherein the plurality of pass gates is respectively coupled upwards to the corresponding first selection line, the plurality of word lines and the second selection line through a plurality of connection areas, and is arranged under the plurality of connection areas, wherein each of the plurality of connection areas extends from the first sub-array to the second sub-array, at least one of extension structures of the first selection line, the plurality of word lines, and the second selection line is coupled to a corresponding connection area of the plurality of connection areas, and the first selection line, the plurality of word lines, and the second selection line of the first sub-array are respectively coupled to the first selection line, the plurality of word lines and the second selection line of the second sub-array through each of the extension structures.

18. The three-dimensional memory circuit according to claim 17, the first selection line, the plurality of word lines, and the second selection line of the first sub-array are respectively coupled to the first selection line, the plurality of word lines, and the second selection line of the second sub-array through each of the extension structures.

19. The three-dimensional memory circuit according to claim 17, wherein the plurality of pass gates is arranged on one side of the drive circuit, and under the plurality of connection areas.

20. The three-dimensional memory circuit according to claim 18, wherein a half of the plurality of pass gates is provided on one side of the drive circuit, and an other half of the plurality of pass gates is provided on the other side of the drive circuit,
- the plurality of connection areas further includes a plurality of first connection areas and a plurality of second connection areas,
- the extension structures of the first selection line and odd-numbered word lines among the plurality of word lines of the first sub-array are respectively coupled to the half of the plurality of pass gates through corresponding first connection areas in the plurality of first connection areas, and
- the extension structures of even-numbered word lines among the plurality of word lines and the second selection line of the second sub-array are respectively coupled to the other half of the plurality of pass gates.

\* \* \* \* \*